United States Patent
Gowda et al.

[19]

[11] Patent Number: 5,877,715
[45] Date of Patent: Mar. 2, 1999

[54] CORRELATED DOUBLE SAMPLING WITH UP/DOWN COUNTER

[75] Inventors: Sudhir Muniswamy Gowda, Ossining, N.Y.; Hyun Jong Shin, Ridgefield, Conn.; Hon-Sum Philip Wong, Chappaqua, N.Y.; Peter Hong Xiao, San Jose, Calif.; Jungwook Yang, West Nyack, N.Y.

[73] Assignee: International Business Machines Corporation, Armonk, N.Y.

[21] Appl. No.: 873,537

[22] Filed: Jun. 12, 1997

[51] Int. Cl.[6] .............................. H04N 1/40; H03M 1/46
[52] U.S. Cl. ......................... 341/122; 341/118; 348/294; 382/312
[58] Field of Search ..................................... 341/110, 144, 341/155, 159, 122, 118, 132; 382/276, 312; 348/294, 307

[56] References Cited

U.S. PATENT DOCUMENTS

| | | | |
|---|---|---|---|
| 3,668,690 | 6/1972 | Ormond | 341/157 |
| 4,023,160 | 5/1977 | Kirschner | 341/158 |
| 4,523,101 | 6/1985 | Tsunekawa | 250/578 |
| 5,027,117 | 6/1991 | Yoshida et al. | 341/132 |
| 5,708,471 | 1/1998 | Okumura | 348/301 |

Primary Examiner—Howard L. Williams
Assistant Examiner—Peguy JeanPierre

[57] ABSTRACT

Disclosed is a circuit for performing correlated double sampling entirely in the digital domain. In an exemplary embodiment, the circuit includes a plurality of comparators, each having a first input coupled to an associated data line for receiving first and second signals in first and second sampling intervals, respectively. A time varying reference signal is applied to the second input of each comparator. A plurality of up/down counters are coupled to respective ones of the comparators, and each is operable to count in a first direction during the first sampling interval and in an opposite direction during the second sampling interval. Each up/down counter is caused to stop counting when the amplitude of the variable reference signal substantially equals the amplitude of the respective first or second signal. As a result, each up/down counter provides an output representing a subtraction of one of said first or second signals from the other. The invention has particular utility when used in conjunction with a CMOS image sensor.

20 Claims, 5 Drawing Sheets

FIG. 3    TO PROCESSING/IMAGE STORAGE ELECTRONICS

CORRELATED DOUBLE SAMPLING WITH UP/DOWN COUNTER

CROSS REFERENCE TO RELATED APPLICATIONS

This application is related to the following copending U.S. patent applications Ser. No. 08/873,539, entitled IMAGE SENSOR PIXEL CIRCUIT; Ser. No. 08/873,610, entitled IMAGE SENSOR WITH DUMMY PIXEL OR DUMMY PIXEL ARRAY; and Ser. No. 08/876,694, entitled IMAGE SENSOR WITH DIRECT DIGITAL CORRELATED DOUBLE SAMPLING, all of which are by the same inventors as this application, filed on the same day as this application, assigned to the assignee herein and expressly incorporated herein by reference.

FIELD OF THE INVENTION

This invention relates generally to correlated double sampling electronics, and more specifically, to a correlated double sampler employing an up/down counter. The invention has particular utility in image sensing applications such as with a complementary metal oxide semiconductor (CMOS) image sensor.

BACKGROUND

With the advent of multimedia communications, there arises the need for low cost solid state image sensors to complement computers and communication devices to realize practical videotelephones and the like. The image input device is central to any teleconferencing and multimedia application. Recently, CMOS image sensors have been recognized as a viable candidate for the image input device. CMOS image sensors also have utility in other fields such as robotics, machine vision, security surveillance, automotive applications and personnel ID systems through fingerprint/retina scan. A distinct advantage of CMOS image sensors (or imagers) is that signal processing circuits can be readily integrated on the same chip as the imager, thus enabling the design of smart, single-chip image acquisition systems. CMOS imagers are also inherently lower cost than conventional charge coupled devices (CCDs) because they can be manufactured in conventional, widespread CMOS fabrication lines without any process modification.

FIG. 1 schematically illustrates one example of prior art active-pixel CMOS imager circuitry. Imager 10 is single-stage image sensor as disclosed in an article by Mendis et al., entitled "A 128×128 CMOS Active Pixel Image Sensor for Highly Integrated Imaging Systems", IEEE Electron Devices Meeting, p. 583, 1993. A MOS photogate 6 is employed as the light sensitive element in each pixel (imager cell) 18. The transistors within each pixel 18 are typically NMOSFETS due to technology considerations. The overall imager 10 is considered a CMOS imager since CMOS electronics are used in conjunction with the imager cells. For example, the transistors 3 within readout circuit 31 are typically PMOSFETS. As shown in the simplified block diagram of FIG. 2, imager 10 includes a plurality of such cells 18 arranged in an array of rows $R_1$–$R_M$ and columns $C_1$–$C_N$. Typically, only one row at a time is activated for image charge readout from all the cells 18 in that row. Timing and control logic 14 provides row select signals (VROW) on row select lines $RSL_1$–$RSL_M$ to select the active row. RESET pulses on lines $RES_1$, to $RES_M$ are also generated by logic block 14 for application to cells 18. The light-induced charge from each activated cell is read out as a corresponding voltage on one of column data lines $15_1$ to $15_N$, each of which is connected to the cells 18 in respective columns $C_1$ to $C_N$. The voltage on each line $15_i$ corresponds, at any given time, to the image charge of only one activated cell in the associated column $C_i$ and activated row. Readout circuits $31_1$ to $31_N$ read out the voltage of the activated cell in the corresponding column $C_1$–$C_N$. A load transistor 28 is utilized on each column bus. Capacitance Cc represents the bus line capacitance. Bus lines $19_1$ to $19_M$ carry voltages VDD, $V_{PG}$ and $V_{TX}$ to the respective cells 18. Processing/image storage electronics 16 receives the voltages from the readout circuits for storage in memory and subsequent processing and display. Logic blocks 14 and 16, which are clock synchronized, include CMOS electronics.

As shown in FIG. 1, within each cell 18, photo-charge "q" collected under photogate transistor 6 is transferred through a dc-biased transfer gate transistor 8 to a floating diffusion diode 7 formed beneath substrate surface 9. This floating diode 7 is periodically dc-restored by the application of a logic high RESET pulse to the gate of reset FET 11, thus resetting the potential of diode 7 (i.e., at circuit node 17) to a voltage (VDD–$V_{th}$) determined by the threshold voltage $V_{th}$ of FET 11 and the power supply voltage (VDD). Following each diode reset cycle, the photo-charge is transferred to floating diode 7. The voltage on diode 7 then corresponds to the intensity of light that was incident upon the associated imager cell 18 before the transfer step. This voltage sets the potential of the gate of source follower FET 13, which amplifies or buffers the voltage appearing at its gate terminal for subsequent readout. When row select transistor 12 is turned ON by a VROW pulse on row select line RSL, the voltage at circuit node 17 is detected by readout circuit 31 detecting corresponding voltage on column bus 15.

The reset noise may be removed by a variation of the correlated double sampling (CDS) technique as disclosed in an article by White et al., entitled "Characterization of Surface Channel CCD Image Arrays at Low Light Levels", IEEE Journal of Solid State Circuits, vol. SC-9, p. 1, 1974. When used in CMOS image sensors, this correlated double sampling technique effectively removes the fixed pattern noise of the image sensor arising from offset errors due to transistor mismatches in manufacturing. To remove reset noise of reset switch 11, the reset level measured on column bus 15 is subtracted from the signal level on the column bus, where the reset level is obtained just prior to the transfer of photo-charge to diode 7. As such, any offset errors due to transistor mismatches is canceled since both levels are measured at the same circuit point. In the embodiment of Mendis et al., the reset level and the signal level are stored on two separate sample and hold capacitors CR and CS, via two separate switches S1 and S2, respectively. Two identical readout circuit portions are required, one for the reset level, and one for the signal level. Further differential amplification at the multiplexed column output (within circuit block 16) is required to complete the reset noise removal operation.

One drawback of the Mendis-type imager 10 of FIGS. 1 and 2 is that the CDS operation is performed in the analog domain, using capacitors CR and CS to temporarily store the reset and signal samples, respectively. These analog circuits are susceptible to noise and gain errors, reducing the accuracy of the image data. In addition, the capacitor CR used to store the reset sample must have a large area to minimize noise. Further, since there are separate paths for the reset and signal samples, mismatches in the two paths are not corrected. Instead, the mismatches are propagated. Accordingly, there is a need to overcome these deficiencies.

SUMMARY OF THE INVENTION

The present invention is directed to a circuit for performing correlated double sampling entirely in the digital domain. In an exemplary embodiment, the circuit includes a plurality of comparators, each having a first input coupled to an associated data line for receiving first and second signals in first and second sampling intervals, respectively. A time varying reference signal is applied to the second input of each comparator. A plurality of up/down counters are coupled to respective ones of the comparators, and each is operable to count in a first direction during the first sampling interval and in an opposite direction during the second sampling interval. The counters are not reset between the first and second sampling intervals. Each up/down counter is caused to stop counting when the amplitude of the variable reference signal substantially equals the amplitude of the respective first or second signal. As a result, each up/down counter provides an output representing a subtraction of one of the first or second signals from the other.

The variable reference voltage may be generated by an additional counter that counts in one direction during both the first and second sampling intervals, and a digital to analog converter coupled to the output of the additional counter to convert the output count to a ramping analog reference voltage that ramps during both the first and second time intervals. The additional counter is reset between the first and second sampling intervals.

The present invention has particular utility when used in conjunction with a CMOS image sensor, in which case a plurality of column data lines are directly connected to the respective first input terminals of the comparators. Advantageously, the image sensor in conjunction with the correlated double sampling circuitry of this invention eliminates the large, noisy analog capacitors used in prior art CMOS image sensors, while minimizing the on-chip circuitry required to implement the digital correlated double sampling.

BRIEF DESCRIPTION OF THE DRAWINGS

Preferred embodiments of the present invention are described herein with reference to the drawings, in which like reference numerals identify similar or identical components throughout the several figures, wherein.

DETAILED DESCRIPTION OF THE PREFERRED EMBODIMENTS

An exemplary embodiment of the present invention will be described below for purposes of illustration as correlated double sampling circuitry used in conjunction with an image sensing device. While the invention has particular utility in image sensor applications, it may have other applications as well. The invention can be employed in essentially any application that uses correlated double sampling (CDS) where two signals are sampled and one is subtracted from the other to remove noise, offset or other errors from the data.

As discussed above, prior art CMOS image sensors typically utilize a pair of analog capacitors to store reset and signal samples. The analog samples are applied to a differential amplifier which produces an output proportional to the voltage difference between the two samples. The analog capacitors, however, add noise to the signal samples, thus diminishing image data accuracy. One way of improving image data accuracy relative to the analog approach is to perform correlated double sampling entirely in the digital domain, as described in copending U.S. patent application Ser. No. 08/876,694 entitled IMAGE SENSOR WITH DIRECT DIGITAL CORRELATED DOUBLE SAMPLING, mentioned above. In that patent application, an embodiment is described in which an analog to digital (A/D) converter is connected directly to each column data line at the bottom of each column. The A/D converter directly converts the reset sample on the column data line to a first digital codeword and outputs the codeword to a register for temporary storage. The register transfers the first codeword to signal processing circuitry for a subsequent operation. The A/D converter then converts the signal sample to a second digital codeword, where the level of the signal sample relative to the reset level corresponds to the amount of light incident upon the pixel cell. The second digital sample is then transferred to the register for subsequent transfer to the signal processing circuitry. The signal processing circuitry subtracts the reset level from the signal level (or vice versa) to obtain an image datum with the reset level and associated noise removed.

While the above-described direct digital approach advantageously eliminates the drawbacks of the analog technique, the present invention provides a further improvement by reducing the on-chip circuitry required to implement the correlated double sampling. With the invention described herein, the subtraction of the reset sample from the signal sample is performed automatically in the A/D converters, thus eliminating the need for the signal processor to perform the subtraction operation.

Figure 2:
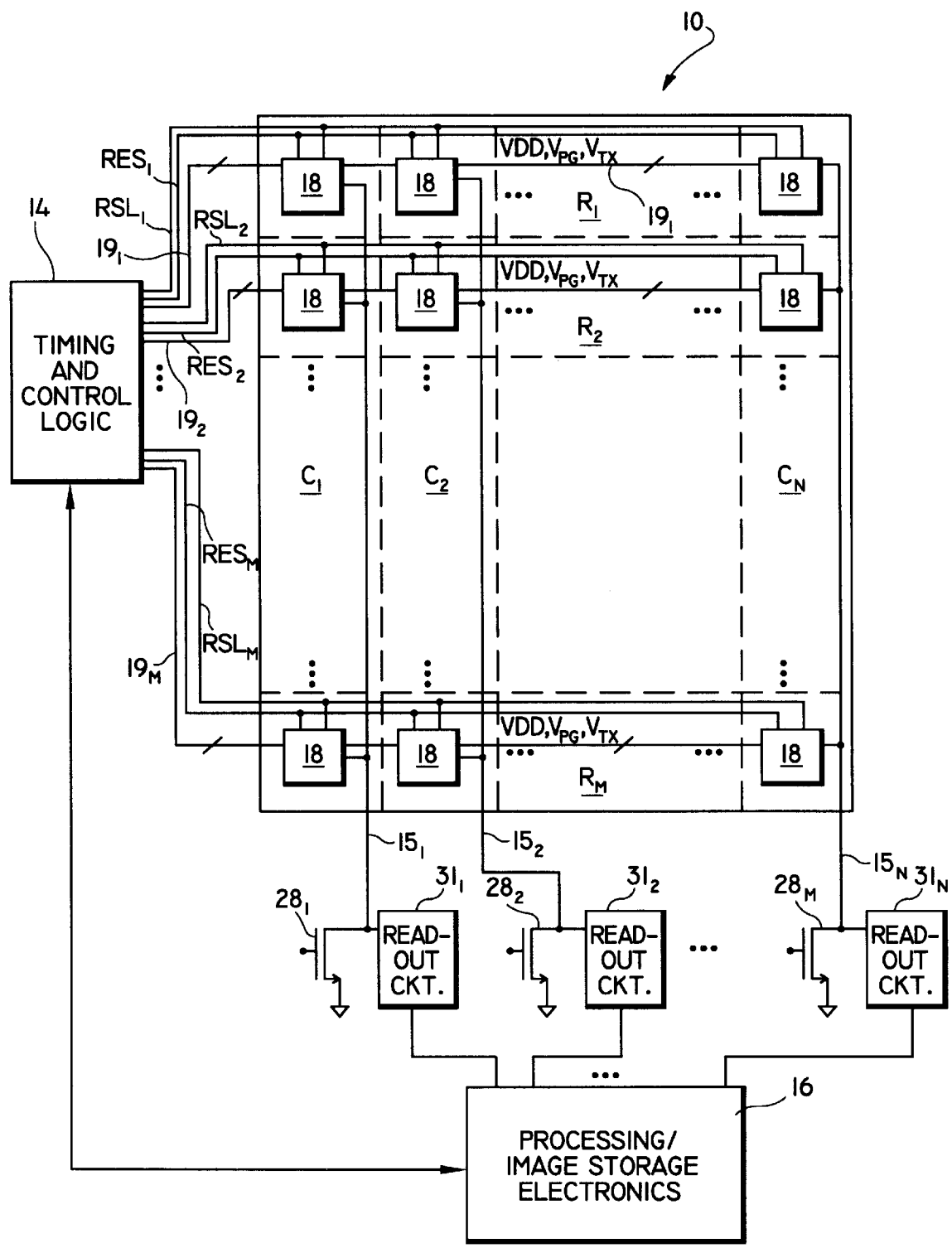
FIG. 2 is a schematic block diagram of a prior art image sensor including a sensor array and associated electronics.
Figure 3:
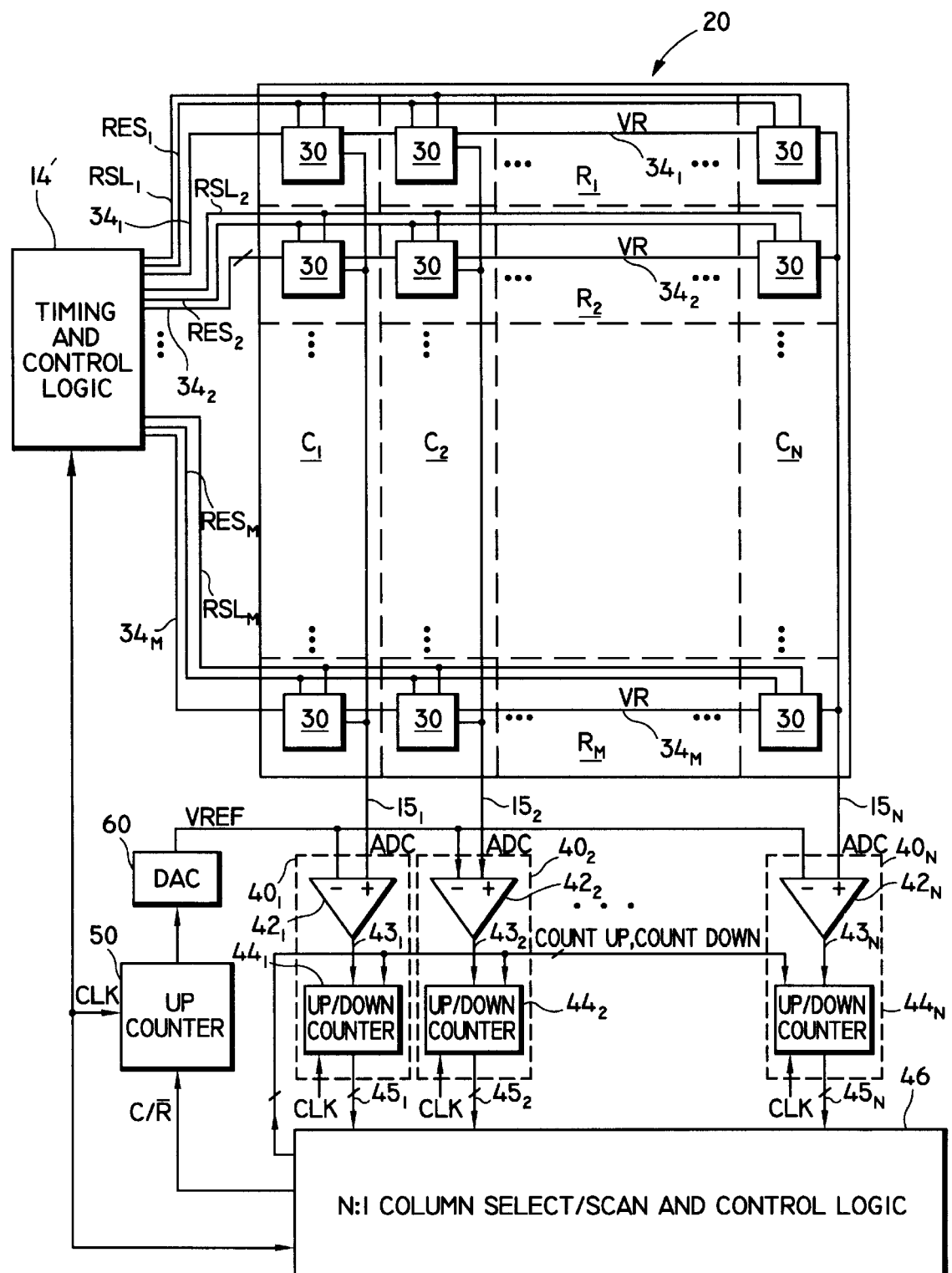
FIG. 3 is a schematic block diagram of an image sensor in accordance with the present invention.

Referring now to FIG. 3, an exemplary embodiment of an image sensing device 20 in accordance with the present invention is schematically illustrated. Device 20 includes a plurality of imager cells (pixels) 30 arranged in M rows $R_1$ to $R_M$ by N columns $C_1$ to $C_N$. A major difference between image sensor 20 and the prior art image sensor discussed above (FIG. 2) is that analog to digital converters (ADC) $40_1$ to $40_N$ are utilized at the bottom of respective columns $C_1$ to $C_N$ in place of the analog readout circuits. Each A/D converter such as $40_j$ in the "jth" column $C_j$ includes a comparator $42_j$ and an up/down counter $44_j$. Each column data line as $15_j$ is connected to the non-inverting terminal of the associated comparator $42_j$. A single up counter 50 provides a digital output count to a digital to analog converter (DAC) 60. Up counter 50 and up/down counters $44_1$–$44_N$ are all clock synchronized via clock inputs CLK from control logic 46.

As will be described in further detail below, during a reset sampling interval, up counter 50 counts upward whereby DAC 60 outputs a ramped reference voltage VREF. This reference voltage is applied to the inverting terminal of each comparator $42_1$–$42_N$. As up counter 50 counts up, each up/down counter 44 counts down in a synchronized fashion. As soon as the reset level on any given column data line $15_j$ is higher than VREF, the logic level output of the associated comparator $42_j$, flips logic state, causing up/down counter $44_j$ to cease counting, whereby the current count is latched and corresponds to the reset level for the pixel 30 being read in that column. During a second readout interval in which the signal level for the active pixel 30 is placed on the column data line, the up counter 50 (which was reset after the first readout interval) counts upward again. Each up/down counter $44_1$–$44_N$ then counts up from the last count corresponding to the reset level just measured for the corresponding pixel 30 being read from. As soon as the signal level on column data line $15_j$ is higher than VREF, the logic output of comparator $42_j$ flips logic state, thereby causing up/down counter $44_j$ to cease counting. At this point, the count corresponds to the signal level minus the reset level, and the correlated double sampling operation is complete. The up/down counter output is then transferred to N:1 column select/scan and control logic 46 as the image datum for the pixel 30 being read from. Logic block 46 transfers the image data to processing and image storage electronics for further processing and/or storage. Timing and control logic 14', which is modified from the prior art to provide the control waveforms described herein, is clock synchronized with logic block 46 to facilitate proper data readout.

Accordingly, since noisy analog capacitors to store the reset and signal levels are obviated, the accuracy of the correlated double sampling is improved. In addition, the size of the overall imager can be reduced via the elimination of the large analog capacitors CR and CS at the bottom of each column while minimizing the on-chip circuitry required to implement the digital correlated double sampling. Moreover, using a single path for the reset and signal levels eliminates error due to path mismatch.

Figure 1:
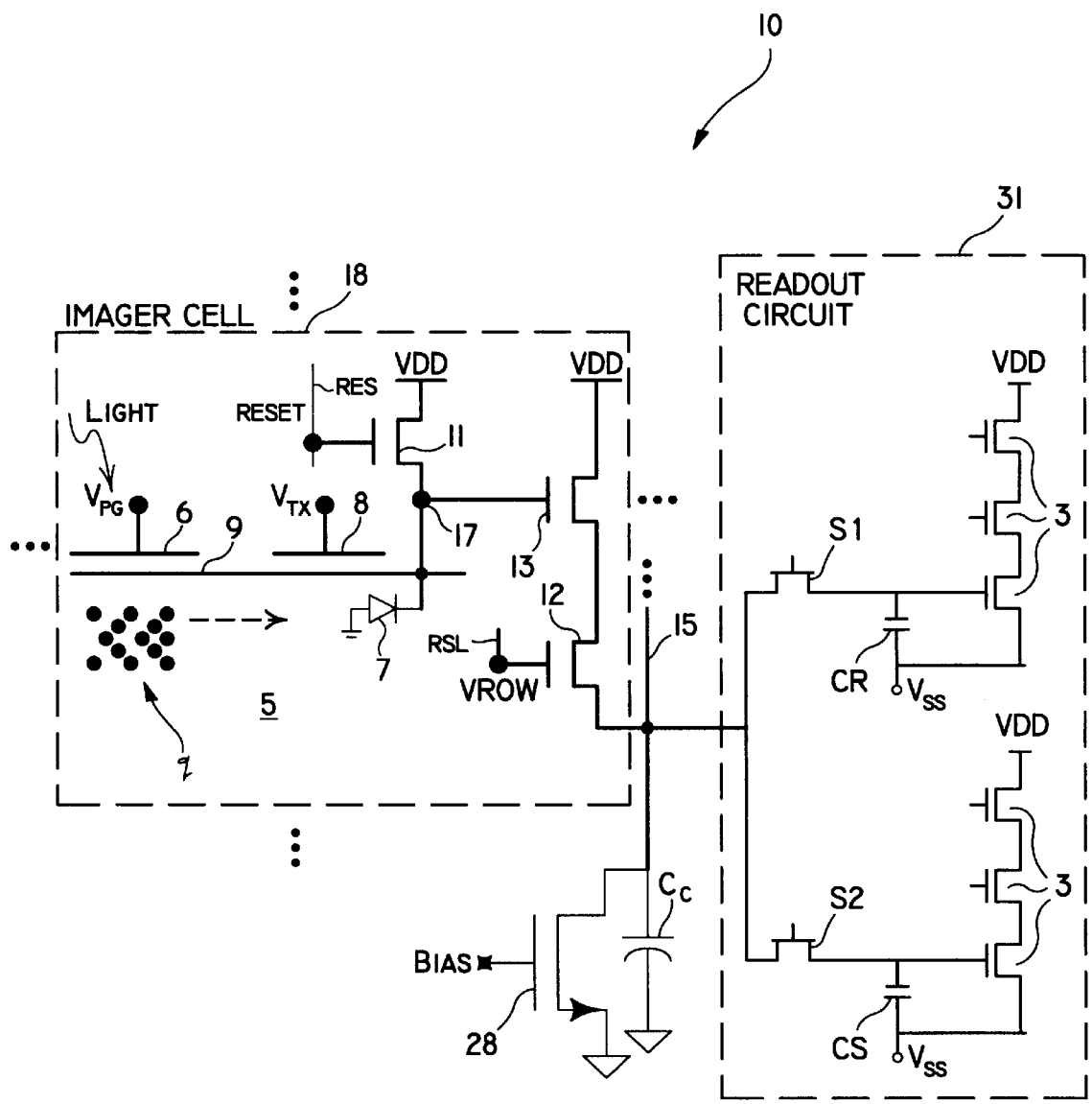
FIG. 1 schematically illustrates a prior art image sensor and pixel circuit.
Figure 4:
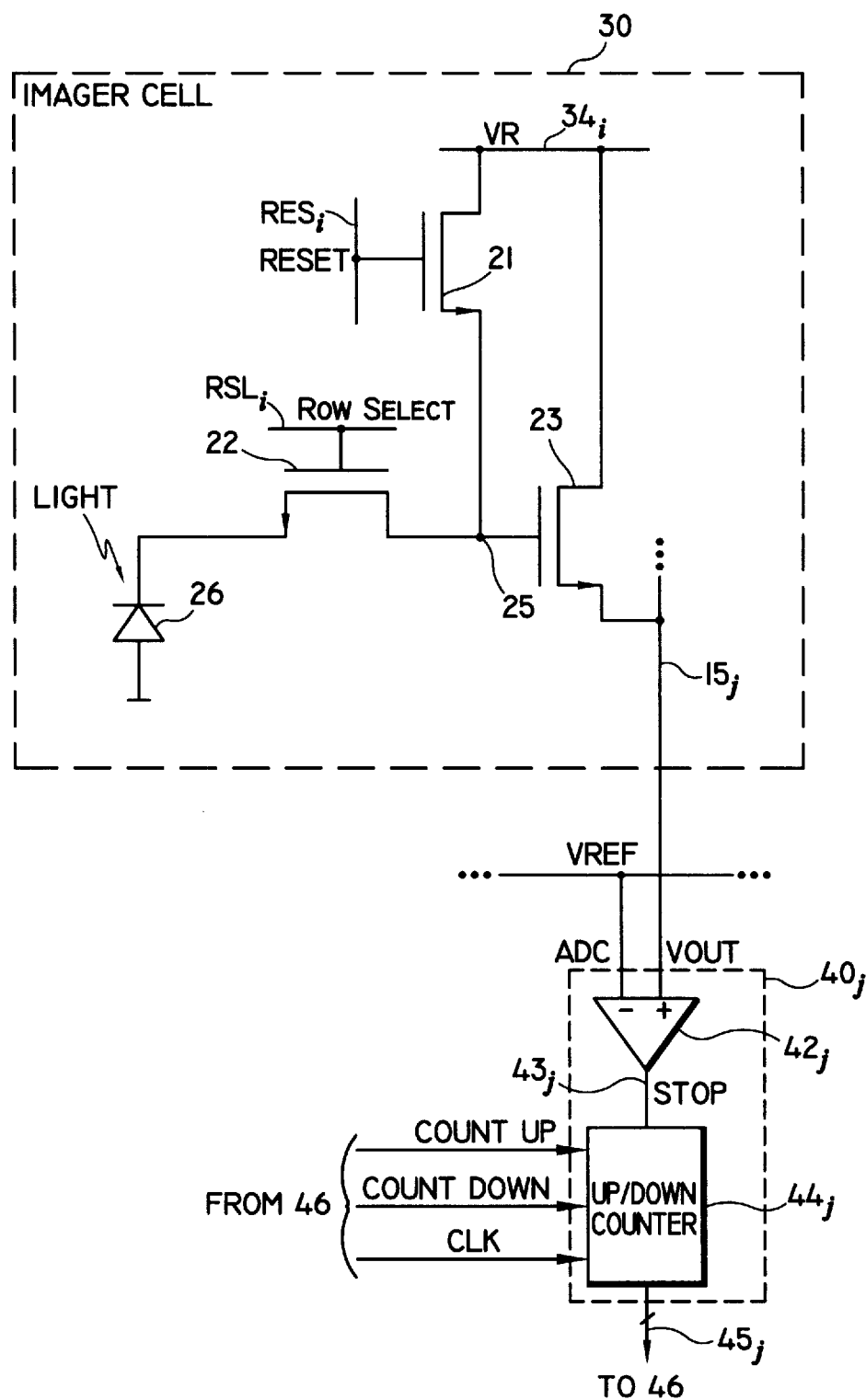
FIG. 4 illustrates an imager cell that may be used in the image sensor of FIG. 3.

Operation and preferred features of image sensor 20 will now be discussed in further detail. Referring to FIG. 4, pixel circuitry for an exemplary imager cell 30 of image sensor array 20 in the "ith" row $R_i$ and the "jth" column $C_j$ is shown. This imager cell is one of those disclosed in our commonly assigned, copending U.S. patent application Ser. No. 08/873,639, entitled IMAGE SENSOR PIXEL CIRCUIT, mentioned above (hereafter, the "S. Gowda et al. I" application). Imager cell 30 is an improvement over the prior art cell of FIG. 1, in that the large row select MOSFET 12 is eliminated, thereby allowing more space for the photosensitive element, in this case, photodiode 26. In addition, less bus lines are required, which likewise creates more space for the photosensitive element. Only three bus lines—RESET line $RES_i$, VR line $34_i$ and Row Select line $RSL_i$—are connected to the imager cells 30 of a common row $R_i$. Hence, with the imager cell 30 of FIG. 4, imager 20 can exhibit improved resolution over the prior art by utilizing the extra space created to provide a larger area for the photosensitive element and/or reduce the overall pixel size.

The pixel circuit of cell 30 eliminates the separate row selection transistor by employing FET 22 to perform both a charge transfer function and a pixel selection function. The row select line $RSL_i$ connects directly to the gate of FET 22. In addition, the pixel selection function is carried out in conjunction with reset transistor 21. As such, reset transistor 21 is functionally different from reset transistor 11 of FIG. 1, which, in the prior art, was used strictly for resetting the reference circuit node 17 (readout node). In the prior art, the bus line RES connecting the gate of FET 11 to timing and control logic 14 is typically tied to multiple rows, whereby the cells of multiple rows are reset together. In the embodiments disclosed herein, each reset bus RES is dedicated for a single row and is not tied to multiple rows, thereby enabling the reset device 21 to perform a partial pixel selection function as well as a reset function.

FET 21 operates to reset the reference circuit node 25 to nearly the voltage level VR on bus line $34_i$, when the RESET signal on the $RES_i$ bus is pulsed. Specifically, the node 25 voltage is reset to $VR-V_{DS21}$, where $V_{DS21}$ is about the same as the threshold voltage $V_{TH}$ of FET 21, typically about 0.4–0.5 volts. As will be explained more fully below, following the application of the RESET pulse, the voltage at reference node 25 is indicative of the reset level (including noise) during a first sampling time interval in which charge transfer device 22 is OFF. During a second sampling interval in which device 22 is ON, the reference node 25 voltage is indicative of photocharge collected by photodiode 26, and hence, the intensity of light incident upon cell 30. The gate of FET 22 is tied to the $RSL_i$ line to receive the ROW SELECT signal. In the prior art, the RSL line is tied to the separate MOSFET 12. With imager cell 30, the relatively small charge transfer FET 22 performs a partial pixel selection function formerly performed by the large MOSFET 12. Source follower FET 23 is used to buffer the voltage at reference node 25 and transfer an output voltage related to the photocharge to column data line $15_j$. At any given time, only one pixel 30 per column is active, as controlled by both the ROW SELECT signal and the RESET signal. As such, the voltage VOUT provided on column bus $15_j$ to associated ADC $40_j$ is directly related to the voltage on reference node 25 of the active pixel.

In any event, image sensor 20 of FIG. 2 may alternatively utilize other pixel circuit configurations for the imager cells 30 used in conjunction with A/D converters 40. The present invention is not limited to an image sensor using the imager cell of FIG. 4. In essence, any pixel circuit which allows the separate sampling of the reset and signal samples can be used within the image sensor 20 of the present invention. For example, any of the other pixel circuit configurations disclosed in the S. Gowda et al. I patent application cited above, may be used in conjunction with A/D converters 40. That patent discloses various modifications to the pixel circuit of FIG. 4 herein, such as: employing a phototransistor in place of photodiode 26; including an anti-blooming transistor within each cell; and including a shutter transistor within each cell to perform electronic shuttering. The Mendis et al. pixel circuit shown in FIG. 1 herein can also be used, although this configuration is not preferred as discussed above.

Figure 5:
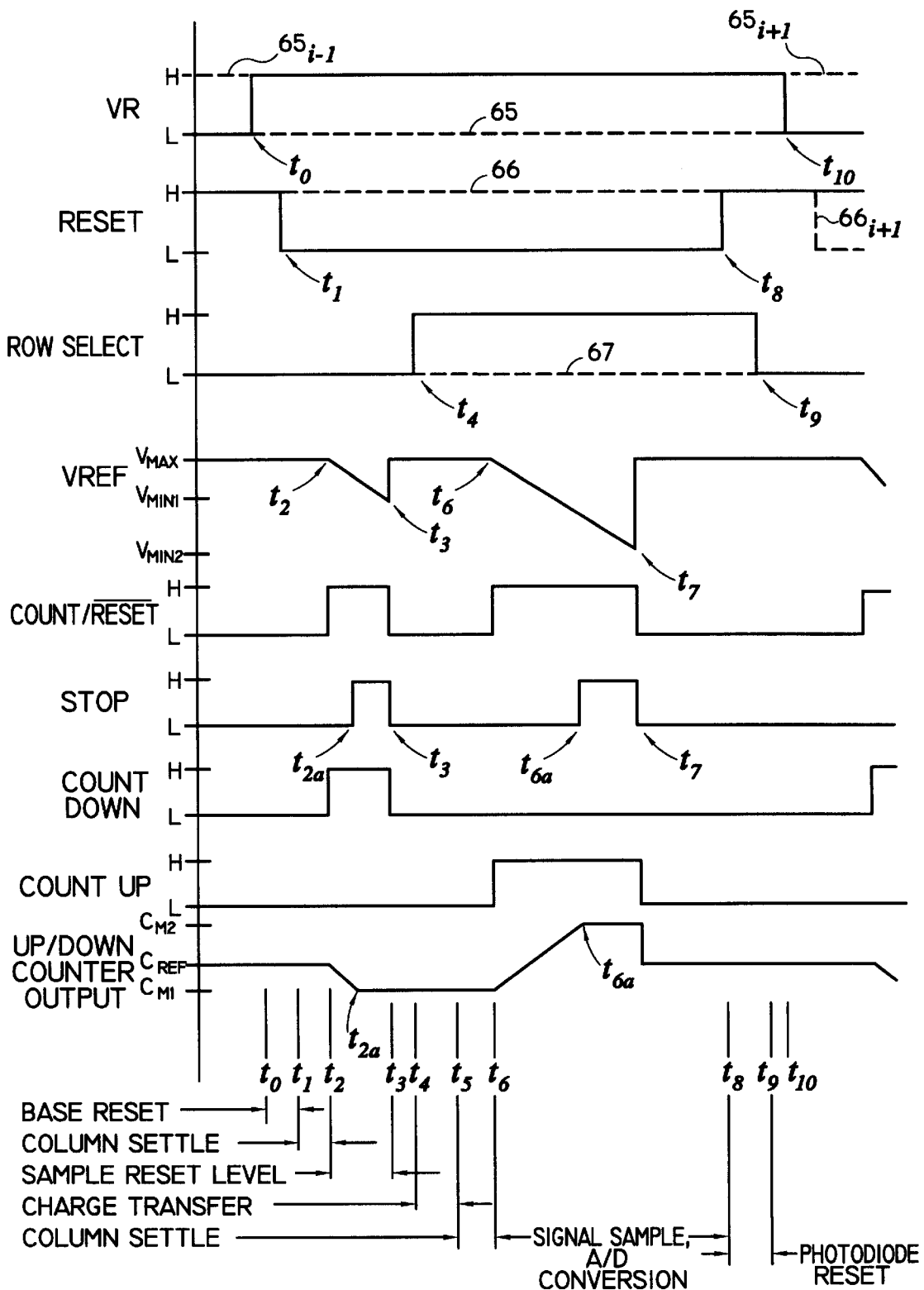
FIG. 5 is a timing diagram of voltage waveforms applied to image sensor cells and to correlated double sampling circuitry within the image sensor of FIG. 3.

Operation of image sensor 20 of FIG. 3 (with imager cells 30 of FIG. 4) will now be described in conjunction with the timing diagram of FIG. 5. The solid lines of the VR, RESET and ROW SELECT waveforms in the diagram represent the waveforms applied to the active pixel 30 of column $C_j$. The dotted lines 65–67 represent the respective waveforms applied to inactive pixels 30 in that column (i.e., inactive during the time interval from time $t_0$ to $t_9$). The ensuing discussion pertains to the active pixel. The time prior to time $t_0$ represents a photocharge collection period for all the pixels in a row (e.g., for the "ith" row, $R_i$). In this period, VR is low, RESET is high, and ROW SELECT is low. "High" potential for the various waveforms discussed herein is typically 1.2, 1.8, 2.5, 3.3 or 5 volts; "low" is typically zero volts. Photocharge is collected in the photodiode during the photocharge collection period and the potential of photodiode 26, relative to the substrate that it is fabricated in, is lowered corresponding to the amount of photocharge collected. Since ROW SELECT is low, FET 22 is OFF and the photocharge does not get transferred out during this time. Also, RESET is high, turning FET 21 ON, whereby reference node 25 is set at a potential close to VR, which is low. As such, the gate of FET 23 is low, turning FET 23 OFF, such that no voltage from that pixel is put on column bus $15_j$. Meanwhile, VR is high for the pixels 30 in the preceding row $R_{i-1}$ as indicated by waveform portion $65_{i-1}$, to permit data readout from the pixels in that row.

At time $t_0$, VR applied to the pixels 30 of row $R_i$ is raised, whereupon a "base reset/read" period commences to set a base reference level at reference node 25 and read out the same. When VR is high, reference node 25 is set to a high potential since FET 21 is still ON. The RESET signal is then brought low at time $t_1$, e.g., five microseconds after time $t_0$, isolating reference node 25 from the VR bus $34_i$. Due to parasitic gate to source capacitance of the reset FET 21, noise on the RES (clock) line feeds through to reference node 25. As such, this "clock feedthrough" due to RESET going low is also stored in circuit node 25. When RESET is brought low at time $t_1$, the potential of node 25 remains close to its previous value when RESET was high due to the capacitance between reference node 25 and the substrate potential. The node 25 potential is then sampled through source follower FET 23, which provides the voltage VOUT on column bus $15_j$ at a value directly related to the reference node 25 voltage, by virtue of the gate to source voltage drop of source follower FET 23.

After an appropriate "column settle" time between times $t_1$–$t_2$, the voltage VOUT, which corresponds to the reset level at this time, is sampled as follows: at time $t_2$, a COUNT/RESET (C/R) signal generated by logic block 46 and applied to up/down counter 50, is raised to a logic high. When high, this signal commands counter 50 to begin counting. Prior to time $t_2$, the count of counter 50 was previously reset to zero following image data readout from the preceding row $R_{i-1}$. When a minimum count of zero is applied to DAC 60, it outputs the voltage VREF as a maximum, $V_{MAX}$. That is, DAC 60 is configured to operate in an "inverse" mode where the output voltage VREF is inversely related to the input count. Hence, as counter 50 counts upward during time interval $t_2$–$t_3$, VREF ramps linearly downward in a staircase from $V_{MAX}$ at time $t_2$ to a first minimum level $V_{MINI}$ at time $t_3$. The C/R signal is brought low at time $t_3$ which resets the count to zero and VREF back at $V_{MAX}$. The voltage range of $V_{MINI}$ to $V_{MAX}$ is established based on the expected extremes of the voltage range at reference node 25 within the pixels 30 during the reset period. This range is preferably determined based on experimental observation of the reference node voltage for typical pixels.

During the time interval from $t_2$–$t_3$, a COUNT DOWN pulse from logic block 46 is applied to each one of the up/down counters $44_1$–$44_N$ to cause each counter to count down, beginning at time $t_2$, from a predetermined reference count $C_{REF}$ which is preferably all zeroes, e.g., 00000000 for an 8-bit counter. The count of each up/down counter is decreased in synchronism with the count of up counter 50 being increased. (The first down count from an all zeroes count is an all ones count). As each up/down counter as $44_j$ counts down, it receives a logic level output, designated STOP from the associated comparator $42_j$ on line $43_j$ (see FIG. 4). The STOP signal is in a first state, e.g., low, when VREF exceeds VOUT. When a low STOP level is received by up/down counter $44_j$, the downward counting proceeds uninhibited. As VREF ramps downward, as soon it falls below VOUT, the STOP level output by comparator $42_j$ flips to the opposite (high) state. Up/down counter $44_j$ responds to this changed state by ceasing to count, whereby the count is latched at a value substantially corresponding to the reset level VOUT for the active pixel 30. In FIG. 5, STOP is shown rising high at time $t_{2a}$, latching the up/down counter output count at a first measured count $C_{M1}$.

It is noted that sampling is avoided during the column settle interval ($t_1$ to $t_2$) to avoid sampling transient noise associated with the reset FET 21 being rapidly turned off. The column settle interval $t_1$–$t_2$ may be, e.g., one microsecond.

During the readout interval for row $R_i$, i.e, between times $t_0$–$t_9$, it is important that no voltage be put on the column bus by the pixels in the other rows, which would otherwise diminish accuracy of the reset and signal data readout from the active pixels. As such, the VR, RESET and ROW SELECT signals applied to the inactive pixels are low, high and low, respectively, as indicated by respective waveform portions 65, 66 and 67. The source follower FET 23 of the inactive pixels will then be off during this time. As such, the output voltage provided on each column bus as $15_j$ corresponds only to the reference node 25 voltage of the active pixel 30 in that column.

A charge transfer interval for the active pixels commences at time $t_4$ by raising the ROW SELECT signal applied to row $R_i$. This turns on the charge transfer FET 22 of the pixels 30 in row $R_i$, thereby allowing the charge collected in photodiode 26 to be transferred from the photodiode capacitance to the capacitance at reference node 25. (In some photodiode designs, the charge may be shared among the photodiode capacitance and the reference node capacitance). The potential of reference node 25 will fall corresponding to the amount of electrons collected in photodiode 26, which, in turn, is proportional to the intensity of light that was incident upon the photodiode. VOUT will fall corresponding to the reference node 25 potential. Thus, if a dark condition exists, VOUT will be close to the reset level. If a high intensity light (bright light) is incident upon the active pixel, VOUT will fall towards a minimum level.

The charge transfer interval $t_4$–$t_5$ is typically on the order of two microseconds. After a second column settle interval between times $t_5$–$t_6$, the COUNT/RESET signal is brought high again at time $t_6$, causing up counter 50 to start counting again starting from the minimum count of zero. Hence, VREF ramps down again from $V_{MAX}$ at time $t_6$ to a predetermined value $V_{MIN2}$ at time $t_7$. $V_{MIN2}$ is established as a voltage below the minimum that would be expected for any of the active pixels 30 in the signal read period, preferably based on experimental observation. At time $t_6$, a COUNT UP signal, generated by logic block 46 and applied to each of up/down counters $44_1$–$44_N$, is brought high, thereby causing each up/down counter to start counting upward from its previous count $C_{M1}$ corresponding to the reset level just measured. The upward count of up/down counter $44_j$ continues as long as the STOP signal output by comparator $42_j$ is low, which will be the case when VREF exceeds VOUT. As soon as VREF falls below VOUT, STOP flips high, causing up/down counter $44_j$ to stop counting and to latch at its current count, e.g., $C_{M2}$. The difference in the count of up/down counter $44j$ between the count at times $t_6$ and $t_{6a}$, i.e., $C_{M2}$–$C_{M1}$, corresponds to the voltage level of the signal sample (second sample). Thus, when the count stops, the absolute count of $C_{M2}$ is latched and corresponds to the signal level for the active pixel minus the reset level just measured. This completes the correlated double sampling operation, whereby errors due to transistor mismatches, offsets and noise are substantially eliminated in the final image data.

The output count of each up/down counter $44_1$–$44_N$ is then transferred to logic block 46 after time $t_7$ and before the readout interval for the pixels of the next row $R_{i+1}$. The transfer to logic block 46 preferably occurs simultaneously for all columns, in either a bit serial or a bit parallel fashion.

When the output count for any up/down counter is transferred out, the count for that up/down counter is reset to the all zeroes count. In the example of FIG. 5, the output count transfer for each up/down counter occurs approximately at time $t_7$. Logic block 46 outputs the final image data corresponding to each pixel 30 in the array to image storage and processing electronics.

After the signal read time interval (designated as the time interval from t6–t8) photodiode 26 needs to be reset to a high potential before the next cycle of photocharge collection can begin. This is accomplished by raising the RESET signal at time $t_8$ high, while keeping the ROW SELECT and VR bus signals high. As such, reference node 25 will be high, and the photodiode is reset to a high potential since FET 22 is ON. Following this operation, ROW SELECT is brought low again at time $t_9$ to turn FET 22 OFF and isolate reference node 25 from photodiode 26, which begins another cycle of photocharge collection. RESET remains high and VR goes low at time $t_{10}$, thus inactivating source follower FET 23 and allowing FET 23 of other pixel rows to put signals on column bus $15_j$. This is illustrated by waveform portions $65_{i+1}$ and $66_{i+1}$ representing the respective waveforms applied to the next row $R_{i+1}$.

If a pinned photodiode is used for the photosensitive element, the photocharge collected in the pinned photodiode can be completely transferred to reference node 25 without charge sharing. In the pinned photodiode case, the photodiode reset period is not necessary because the signal read results in complete charge transfer and the photodiode is reset as it is read.

For applications in which slow image data readout from the pixels is acceptable, it is possible to utilize a lower number of up/down counters 44 and/or a lower number of comparators 42 than the number of columns. In this case, time multiplexing of the data on the column data lines would be necessary via appropriate switches added to the circuit. In an extreme case, it is possible to use a single comparator with a single up/down counter.

While the above description contains many specifics, these specifics should not be construed as limitations on the scope of the invention, but merely as exemplifications of preferred embodiments thereof. For example, a down counter may be utilized as an alternative to the up counter (50) described above, and/or the counting directions of the up/down counters (44) may be reversed. Moreover, rather than using voltage comparators at the bottom of each column, current type comparators may be utilized, each of which compares a current on the column data line with a time varying reference current. In addition, it may be possible to utilize bipolar devices within the pixels as alternatives to FETS. Further, the correlated double sampling circuitry of this invention may be used in applications other than those involving image sensors, such as with temperature/pressure sensors. Still further, the invention can be used in conjunction with an image sensor comprising a single row of pixels. Those skilled in the art will envision many other possible variations that are within the scope and spirit of the invention as defined by the claims appended hereto.

What is claimed is:

1. A circuit for performing correlated double sampling, comprising:
    at least one comparator having a first input coupled to an associated data line for receiving first and second signals in first and second sampling intervals, respectively, and a second input coupled to receive a time varying reference signal; and
    at least one up/down counter operable to count in a first direction during said first sampling interval and in an opposite direction during said second sampling interval, said up/down counter being responsive to an output of said comparator to stop counting during both of said first and second sampling intervals when the amplitude of the time varying reference signal substantially equals the amplitude of the respective first or second signal, whereby said up/down counter provides an output representing a subtraction of one of said first or second signals from the other.

2. The circuit of claim 1, further comprising:
    an additional counter operative to count in one of an up or down direction during each of said first and second sampling intervals, said additional counter being reset between said first and second sampling intervals; and
    a digital to analog converter coupled to an output of said additional counter, for converting the additional counter output to said time varying reference signal which ramps during each of said first and second sampling intervals.

3. The circuit of claim 1, wherein said first and second signals on each said data line are voltages, each comparator is a voltage comparator, and said time varying reference signal is a voltage.

4. The circuit of claim 3, wherein each said comparator provides a logic level output to an associated up/down counter, each up/down counter being responsive to a predetermined state of said logic level output to stop counting, thereby producing a stopped count, each up/down counter being caused to commence counting during the second sampling interval from the stopped count.

5. The circuit of claim 1, wherein said up/down counter is in an all zeroes state prior to said first sampling interval, and is reset to the all zeroes state following the subtraction, for a subsequent sampling operation.

6. The circuit of claim 1, wherein said at least one comparator and said at least one up/down counter comprises a plurality of comparators and a plurality of up/down counters, respectively, and said circuit further comprising in combination therewith, an image sensing device having a plurality of imager cells arranged in rows and columns, and a plurality of column data lines connected to cells within each column, each column data line being connected to an associated one of said comparators, wherein said image sensing device provides said first signal indicative of a reset level from an active imager cell in each column during said first sampling interval, and said second signal indicative of an amount of light incident upon the active imager cell during said second sampling interval.

7. The circuit of claim 6, wherein each imager cell comprises:
    a photosensitive element providing a photocharge responsive to incoming light;
    a first transistor coupled to a row select line carrying a row select signal to imager cells of a common row to selectively activate the imager cells of the common row for image data readout, said first transistor operable to transfer said photocharge towards a reference circuit node within said imager cell responsive to said row select signal;
    a second transistor operably coupled to said first transistor, said second transistor operative to selectively set a voltage level at said reference node; and
    a third transistor having a control terminal coupled to said reference node, and an output terminal coupled to the column data line of the column associated with the particular imager cell, said third transistor providing said first output indicative of potential of said reference node during said first sampling interval in which said first and second transistors are both off, and said signal output indicative of potential of said reference node during said second sampling interval.

8. The circuit of claim 6, further including complementary metal oxide semiconductor (CMOS) circuitry for providing timing and control signals to the imager cells.

9. The circuit of claim 1, further including means for ramping said time varying reference signal from a maximum level to a first minimum level during the first sampling interval, and from said maximum level to a second minimum level lower than said first minimum level during the second sampling interval.

10. An image sensing device having correlated double sampling circuitry, said image device comprising:

a plurality of imager cells arranged in rows and columns, with the imager cells of any given column being coupled to a column data line of that column, and each imager cell being operable to selectively provide a first signal on an associated column data line indicative of a reset level during a first sampling interval and to provide a second signal on the associated column data line during a second sampling interval indicative of an amount of light incident upon that imager cell;

a unidirectional counter operative to count in one of an up or down direction during each of said first and second sampling intervals;

a digital to analog converter coupled to an output of said unidirectional counter, for converting an output thereof to a time varying reference signals which ramps during each of said first and second sampling intervals;

a plurality of comparators, each having a first input coupled to an associated one of said column data lines for receiving said first and second signals in the first and second sampling intervals, respectively, and a second input coupled to receive said time varying reference signal; and a plurality of up/down counters, each operable to count in a first direction during said first sampling interval and in an opposite direction during said second sampling interval, each of said up/down counters being responsive to an output of one of said comparators to stop counting during each of the first and second time sampling when the amplitude of the time varying reference signal substantially equals the amplitude of the respective first or second signal, whereby each said up/down counter provides an output representing a subtraction of one of said first or second signals from the other to complete a correlated double sampling operation.

11. The image sensor of claim 10, wherein said unidirectional counter is responsive to timing and control circuitry to count from a predetermined reference count to cause said time varying reference signal to ramp from a maximum level to a first lower level during the first sampling interval, said unidirectional counter being reset between the first and second sampling intervals, and counting during said second sampling interval to cause said time varying reference signal to ramp from said maximum level to a second lower level during the second sampling interval, said second level being lower than said first level.

12. The image sensor of claim 10, wherein each said comparator provides a logic level output to an associated one of said up/down counters, and each up/down counter being responsive to a predetermined state of said logic level output to stop counting.

13. The image sensor of claim 10, wherein said comparators are voltage comparators.

14. The image sensor of claim 10, wherein each imager cell comprises:

a photosensitive element providing a photocharge responsive to incoming light;

a first transistor coupled to a row select line carrying a row select signal to imager cells of a common row to selectively activate the imager cells of the common row for image data readout, said first transistor operable to transfer said photocharge towards a reference circuit node within said imager cell responsive to said row select signal;

a second transistor operably coupled to said first transistor, said second transistor operative to selectively set a voltage level at said reference node; and a third transistor having a control terminal coupled to said reference node, and an output terminal coupled to the column data line of the column associated with the particular imager cell, said third transistor providing said first output indicative of potential of said reference node during said first sampling interval in which said first and second transistors are both off, and said signal output indicative of potential of said reference node during said second sampling interval.

15. The image sensor of claim 14, wherein said photosensitive element comprises a photodiode.

16. The image sensor of claim 10, further including complementary metal oxide semiconductor (CMOS) timing and control logic for providing control signals to said image sensor.

17. A method for performing correlated double sampling, comprising the steps of:

digitally counting in a first direction during a first sampling interval;

comparing a first signal to a time varying reference signal during the first sampling interval and stopping said counting when the first signal and the time varying reference signals are substantially equal to produce a first count;

digitally counting, from said first count, in an opposite direction to said first direction during a second sampling interval; and comparing a second signal to the time varying reference signal during the second sampling interval and ceasing to count when the second signal substantially equals the reference signal, to thereby produce a second count which represents a subtraction of one of said first and second signals from the other.

18. The method of claim 17, further comprising ramping down said time varying reference signal from a predetermined maximum value to a first lower value during said first sampling interval, raising the level of said time varying reference signal to said maximum value in a time interval between said first and second time intervals, and ramping down said time varying reference signal from said predetermined maximum value to a second lower value lower than said first lower value.

19. The method of claim 17, wherein said time varying reference signal is generated by sequentially incrementing a digital count and converting said digital count to an analog signal.

20. The method of claim 19, wherein said analog signal is one of a voltage or a current.

* * * * *